United States Patent [19]

Groth et al.

[11] Patent Number: 4,497,700
[45] Date of Patent: Feb. 5, 1985

[54] METHOD OF COATING A TRANSPARENT SUBSTRATE

[75] Inventors: Rolf Groth, Bochum; Dieter Müller, Siegen, both of Fed. Rep. of Germany

[73] Assignee: Flachglas Aktiengesellschaft, Fürth, Fed. Rep. of Germany

[21] Appl. No.: 592,239

[22] Filed: Mar. 22, 1984

[30] Foreign Application Priority Data

Mar. 25, 1983 [DE] Fed. Rep. of Germany ....... 3310916
May 6, 1983 [DE] Fed. Rep. of Germany ....... 3316548

[51] Int. Cl.³ ............................................. C23C 15/00
[52] U.S. Cl. ............................ 204/192 P; 204/192 R; 428/426; 428/428; 428/432; 428/433
[58] Field of Search .................. 204/192 P, 192 R; 428/432, 433

[56] References Cited

U.S. PATENT DOCUMENTS 4,013,532  3/1977  Cormia et al. ....................... 204/192
4,098,956  7/1978  Blickensderfer ..................... 428/432
4,337,990  7/1982  Fan et al. ........................... 204/192 P
4,450,201  5/1984  Brill et al. ........................... 428/432
4,462,883  7/1984  Hart .................................. 204/192 P
4,462,884  7/1984  Gillery et al. ..................... 204/192 R

FOREIGN PATENT DOCUMENTS 2144242  3/1972  Fed. Rep. of Germany .
2334152  1/1975  Fed. Rep. of Germany .

Primary Examiner—Arthur P. Demers
Attorney, Agent, or Firm—Karl F. Ross; Herbert Dubno

[57] ABSTRACT

Optical filters, e.g. for reflecting infrared radiation while passing visible light radiation is made by applying to the silver reflective coating a protective coating of a metal oxide by magnetron cathode sputtering and only thereafter is the dereflective layer applied by magnetron cathode sputtering. The protective coating-oxygen partial pressure and coating rate are substantially less than the dereflective coating-oxygen partial pressure and coating rate. Apparently the protective coating prevents damage to the reflective coating.

10 Claims, 2 Drawing Figures

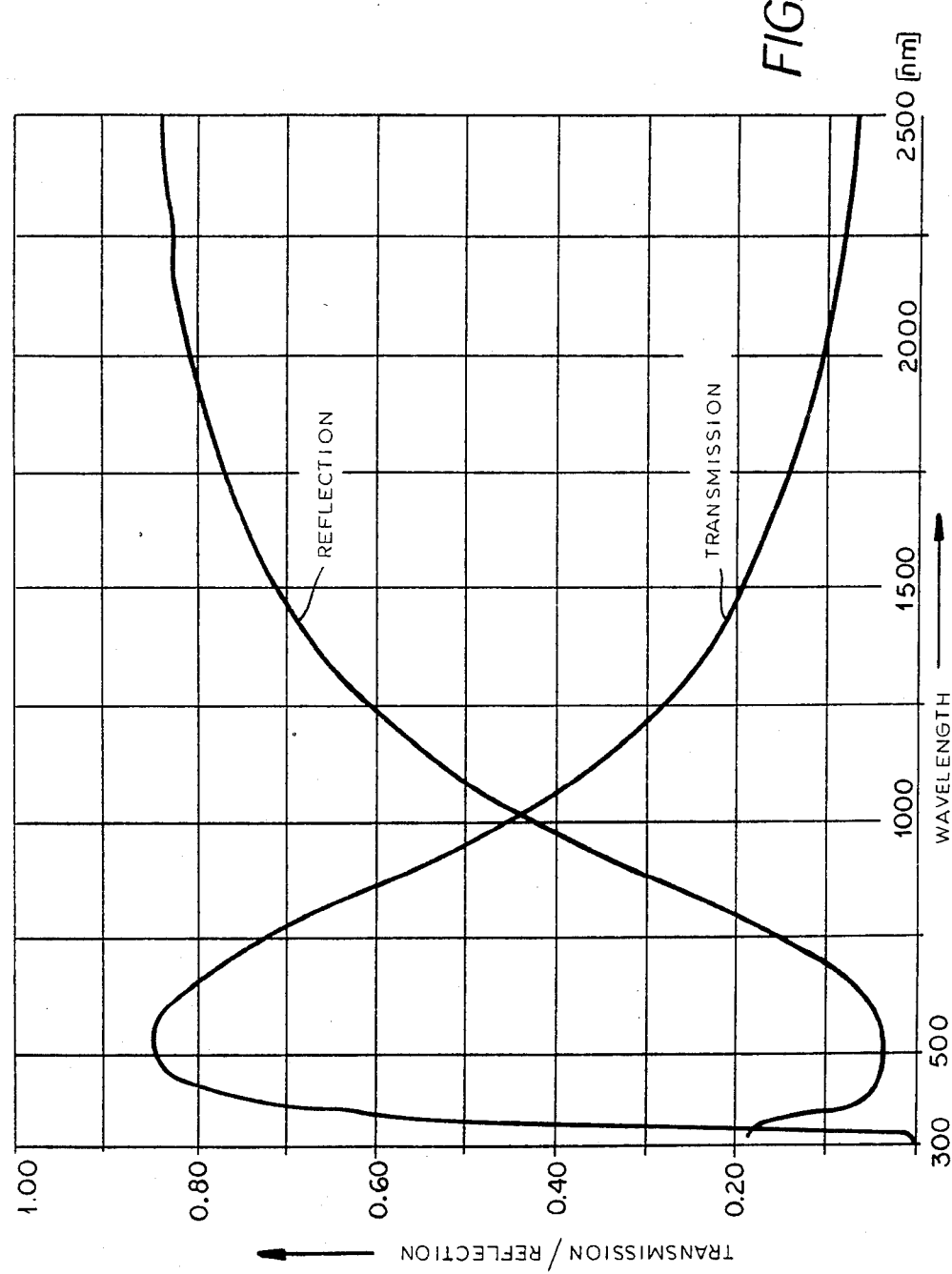

METHOD OF COATING A TRANSPARENT SUBSTRATE

FIELD OF THE INVENTION

Our present invention relates to a method of coating a transparent substrate with a plurality of coatings adapted to form an optical filter. More particularly the invention relates to the production of complex optical filters by plural coating of a transparent substrate including at least one silver coating and at least one dereflective tin oxide coating.

BACKGROUND OF THE INVENTION

It is known to utilize magnetron cathode vapor deposition on a substrate to apply a dereflective coating of tin oxide to an optical filter composed of a plurality of coatings on a transparent substrate, at least one of which includes silver. In general, the magnetron cathode sputtering operation is carried out at a predetermined dereflective coating-oxygen partial pressure (E partial pressure) and at a predetermined dereflective coating or sputtering rate (E sputtering or coating rate). The silver coating or the silver coatings can be applied in various ways although preferably in this field these coatings are also applied by magnetron cathode sputtering.

The dereflective coating is preferably applied with the aid of reactive magnetron cathode sputtering and in general this process is carried out, although this is not essential, continuously on a moving substrate in an apparatus provided with gates or curtains through which the substrate can travel.

Generally the substrate is a glass disk or a pane or a synthetic resin plate.

Thin silver coatings are characterized by a high light permeability (translucency) in combination with a high degree of reflection for infrared rays and hence the coated substrates can be utilized effectively as thermal barriers for windows and the like. When such windows are utilized in dwelling or commercial structures, for example, infrared ray incursion is restricted without materially reducing the visible light penetration. Hence windows formed or provided with such coated glass panes or layers can be utilized to assist in air conditioning to thereby reduce the amount of energy which is required to maintain a predetermined temperature in the building.

To improve the selectivity characteristics of silver coatings, it has been found to be advantageous to apply to the surface of the silver coating which is turned away from the substrate a dereflective coating which is effective in the visible light range and is composed of a dielectric material with a reflective index greater than 1.7. It has also been proposed, in connection with such filters, to provide between the transparent substrate and the silver coating a further dielectric layer which acts as a bond-promoting agent and which, when formed as a layer in a thickness corresponding to a quarter wavelength, i.e. as a quarter wavelength coating, it additionally provides a dereflective effect.

Between the substrate and the silver layer, however, in practice, one or more further bond-promoting metal oxide layers can be provided and indeed the dereflective coating on the face of silver layer turned away from the substrate can be provided with one or more additional covering layers or coatings.

Mention may also be made of systems in which between the transparent substrate and the silver coating or between the metal oxide coating and the silver coating, additional metal or metal alloy coatings, e.g. of chromium, nickel, titanium or chromium nickel alloys, can be provided to improve the adhesion to subsequently applied coatings. Naturally such coatings are required to be transparent as well, and thus must be extremely thin coatings with a thickness of one or several atoms, i.e. must be practically of monoatomic thickness (see German patent document-open application DE OS 21 44 242).

Magnetron cathode sputtering or atomization is described in U.S. Pat. No. 4,013,532 and is recognized as a vacuum process which allows high coating rates to be obtained. Such processes permit economically the production of relatively thick dereflective coatings by comparison to the silver coating and hence for the production of dereflective coatings of, tin oxide, for example, reactive magnetron atomization is used. In such systems, rather than effecting the atomization in high vacuum or in an inert gas atmosphere, the gas atmosphere is designed to contain oxygen which reacts with the sputtering metal or metal alloys from the appropriate cathode targets to enable in situ formation of corresponding metal oxides or mixed oxides of the metals of the alloy to thereby generate the dielectric dereflective coating material.

To simplify the following discussion, we may refer below to the E partial pressure, this being defined as the dereflective coating-oxygen partial pressure (in mbar), and to the E coating rate (in A/sec) which, of course, will indicate the dereflective coating deposition rate.

It has been found that conventional processes for the application for the dereflective coating upon a silver coating in a reactive oxygen-containing plasma, the infrared reflection characteristics of the silver coating is reduced. Thus if the infrared reflection of the silver coating is 90% before application of the tin oxide coating, tests after the application of the tin oxide coating show an infrared reflection between 10% and 40%.

While a portion of the infrared reflection loss can be partly compensated by making the silver coating somewhat thicker, this in turn results in a loss of transparency in the visible portion of the spectrum, and hence a decrease in the transparency of the filter. As a result, the effectiveness of the filter is diminished.

As far as we have been able to ascertain, the reason for this change in the characteristics of the silver coating as a result of the application of the dereflective coating is unknown.

OBJECTIVES OF THE INVENTION

It is the principal object of the present invention to provide a process for the production of such filters whereby the aforementioned disadvantage no longer arises.

A more specific object of the invention is to provide a filter of the type described in which the reduction in the infrared reflection characteristics of the silver coating, hitherto characterizing earlier methods, does not arise upon the application of the dereflective coating.

Still another object of the invention is to provide a method of making a filter of the class described which enables the application of the dereflective coating by reactive magnetron cathode sputtering without diminishing the infrared reflection characteristics of the silver coating.

SUMMARY OF THE INVENTION

These objects and others which will become apparent hereinafter are attained in accordance with the present invention by the application of a thin metal oxide protective coating to the silver coating prior to the application of the dereflective coating by magnetron cathode sputtering and, more particularly, at a protective coating oxygen partial pressure (hereinafter referred to in short as the S partial pressure) which is lower than the E partial pressure and at a protective coating deposition rate (S coating rate) which is less than the E coating rate, whereupon the dereflective layer is applied. According to a preferred embodiment of the invention, the protective metal oxide coating is applied by a reactive magnetron cathode sputtering.

The metal oxide protective layer can be generated using targets of at least one of the following materials:

Tin, indium, tin-doped indium, lead, zinc, titanium and tantalum so that the coating will generally consist of at least one compound selected from the group constituted by tin oxide, indium oxide, indium oxide doped with tin oxide, lead oxide, zinc oxide, titanium oxide and tantalum oxide.

Naturally, the metal oxide protective layer can be applied by magnetron cathode sputtering utilizing metal oxide targets to produce the coating material. In this case, the targets can consist of at least one compound selected from the group which consists of tin oxide, indium oxide, indium oxide doped with tin oxide, lead oxide, titanium oxide, zinc oxide and tantalum oxide.

According to the invention, the dereflective coating is applied in a coating thickness which is customary in the coating of substrates with optical filters in the previously described manner and for the previously described purpose. The thickness of the protecting coating, the S partial pressure and the S coating rate can be varied over wide ranges.

We have found that best results are obtained when the protective coating is applied at an S partial pressure which is smaller by a factor of at least 0.5 than the E partial pressure and at an S coating rate which is smaller at least by a factor of 0.5 than the E coating rate.

Specifically, the silver coating can have a thickness between 50 Å and 300 Å, the protective coating being applied in a thickness between 20 Å and 100 Å and the dereflective coating, generally of tin oxide, being applied in a thickness between 250 Å and 600 Å. In a preferred embodiment of the invention, moreover, the protective coating is applied at an S partial pressure less than or equal to $3 \times 10^{-4}$ mbar and at an S coating rate of less than or equal to 8 Å per second. The dereflective coating is applied with an E partial pressure greater than or equal to $7 \times 10^{-4}$ mbar with an E coating rate greater than or equal to 20 Å per second and preferably 35 to 40 Å per second.

While the effect is not completely clear, it appears that utilizing conventional reactive magnetron cathode deposition with a reactive plasma to apply the dereflective coating directly to the silver coating results in a partial penetration of atomic particles into at least the uppermost layer of the silver coating which has an adverse effect on the reflectivity characteristics.

However, when the protective coating is applied under the conditions set forth above, the protective coating appears to prevent any damage to the silver coating or to limit such damage to a minimum in spite of the fact that the protective coating is also applied by magnetron cathode deposition and even by a reactive process. Not only does the protective coating itself not adversely affect the reflectivity of the silver coating, but it apparently prevents damage to the underlying silver coating during the subsequent application of the dereflective coating even when the latter is applied with a reactive plasma in reactive magnetron cathode sputtering.

Indeed, and even more surprisingly, the protective effect is obtained even when the protective coatings has a thickness of 200 Å.

When the process is carried out in a continuous displacement apparatus in which the substrate passes through a succession of gates, the cathode or the application of the protective coating can be provided along the path between the cathodes for applying the silver coating and the dereflective coating, the substrate traveling through the sputtering stations in succession.

However, the invention is not limited to such a continuous process and indeed the protective coating and the dereflective coating can be applied in succession with the same cathode with the coating parameters being altered as indicated after the application of the protective coating and for the application of the dereflective coating.

When oxidic targets are used for the application of the protective coating, the coating rates will be less than is the case when the protective coating is applied utilizing metal targets, although the coating rates of the order of several angstroms per second can easily be achieved even with such oxidic targets.

The use of oxidic targets has the advantage that the formation of an oxide layer does not require as high an oxygen pressure in the coating chamber as is the case when metal targets are used and thus there is less danger of oxidic attack on the silver coating from excess oxygen pressure.

BRIEF DESCRIPTION OF THE DRAWING

The above and other objects, features and advantages of the present invention will become more readily apparent from the following description, reference being made to the accompanying drawing in which:

FIG. 2 is a graph illustrating characteristics of the filter of the invention.

SPECIFIC DESCRIPTION

Figure 1:
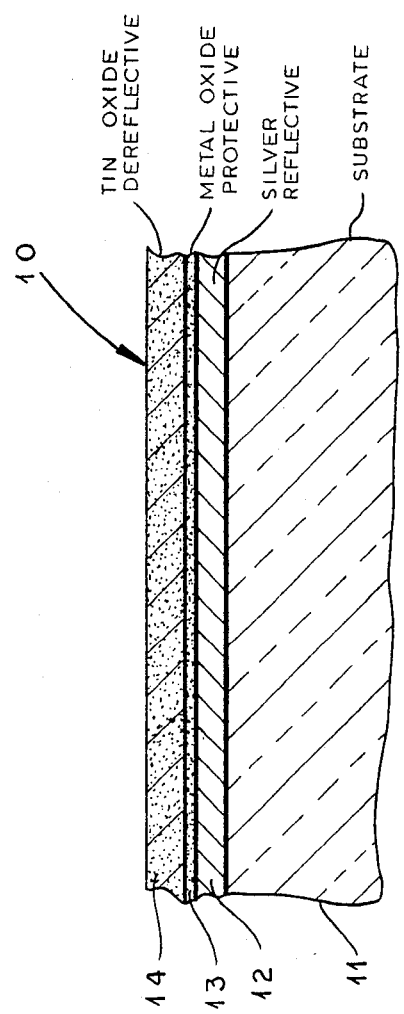
FIG. 1 is a diagrammatic cross section through an optical filter according to the invention.

In FIG. 1 we have shown an optical filter which can be used for the purposes described, i.e. to screen the interior of a building structure from infrared rays while permitting substantially free passage of visible light rays. The optical filter shown in FIG. 1 comprises a substrate 11 of glass or other transparent material on which is applied in a thickness of the order of up to hundreds of angstroms at least one silver reflective layer 12 which is transmissible with respect to visible light but which reflects the infrared.

According to the invention, upon this silver layer 12, a protective layer 13 is applied in the form of a metal oxide generated by reactive magnetron cathode sputtering utilizing a metal target, or by magnetron cathode sputtering utilizing a metal oxide target as the cathode. The usual dereflective coating 14 can then be applied also by reactive magnetron cathode desposition and is tin oxide which serves to remove the reflective appearance while nevertheless permitting the optical filter 10 to operate in the manner described.

SPECIFIC EXAMPLES

EXAMPLE I

A vacuum coating apparatus which is provided with cathodes for magnetron cathode sputtering is utilized to coat a float-glass pane of a thickness of 4 mm and dimensions of 200 cm×100 cm. The substrate surface is subjected to a glow discharge precleaning at a pressure of $4 \times 10^{-2}$ mbar. Thereafter, the pressure is reduced to the coating pressure. Coating is effected by passing the float-glass pane at a constant speed past the linear cathodes which each have dimensions of 125 cm×23 cm. For coating, the pane is subjected to the action of three cathodes in succession along its path with targets of silver, tin and an indium-tin alloy consisting of 90% by weight indium and 10% by weight tin in succession.

Consequently, the glass pane is covered with:

A tin oxide coating having a thickness of 330 Å by reactive sputtering of tin in an oxygen-containing plasma or atmosphere; and A tin oxide doped indium oxide coating of a thickness of 40 Å by reactive sputtering of the 90% indium/10% tin alloy also in the presence of oxygen.

These two coatings which are optional form a bond layer between silver coating and the glass.

Then the silver coating in a thickness of 80 Å is applied by sputtering of silver in an argon atmosphere. Note that the adhesion coatings have not been illustrated in FIG. 1 since they are optional, and also preferred other adhesion techniques can be used to insure an effective bond of the silver coating to the glass.

Upon the silver coating, a tin oxide coating of a thickness of 400 Å is applied by reactive sputtering from a tin target at a coating rate of 35 Å per second. The sputtering is effected in an argon/nitrogen oxygen atmosphere with an E partial pressure of $1.4 \times 10^{-13}$ mbar.

A measurement of the infrared reflection of the coated pane with the radiant energy impinging on it from the air side of the coating gave a reflectivity of 12% at a wavelength of 8 mmicrons. The transmissivity of the pane to radiation of 5500 Å amounted to 51%.

EXAMPLE II

In the same manner as in Example I, a flow-glass pane is coated with a 330 Å thickness tin oxide coating, 40 Å thickness coating of indium oxide doped with tin oxide and a silver coating of 80 Å in thickness.

By reactive sputtering and in accordance with the invention, a tin dioxide coating of a thickness of 30 Å is then applied at an S coating rate of 3 Å per second in an argon/nitrogen/oxygen atmosphere with an S partial pressure of $1 \times 10^{-4}$ mbar.

Then a further tin oxide coating is applied to a thickness of 360 Å at an E coating rate of 35 Å per second in the same argon/nitrogen/oxygen atmosphere with an E partial pressure of $1.4 \times 10^{-3}$ mbar used in Example I. Measurement of the infrared reflection of the coated pane with the irradiation being applied from the side carrying the coating gave a reflection value at a wavelength of 8 microns, of 92%. Transmissivity to light of a wavelength of 5500 Å was 84%.

EXAMPLE III

In the same way as in Example I a tin oxide coating of 330 Å in thickness, an indium oxide coating doped with tin oxide of a thickness of 40 Å and a silver coating of 80 Å in thickness were applied to the glass pane. Then by reactive sputtering from a cathode constituted by a 90% indium/10% tin alloy, a zinc oxide doped indium oxide coating of a thickness of 30 Å was applied to the silver coating. The coating rate was 2 Å per second and the S partial pressure in the argon/nitrogen/oxygen atmosphere was $8 \times 10^{-5}$ mbar.

The infrared reflection of the coated pane for a wavelength of 8 microns was about 92% while the transmissivity at 5500 Å was 84.5%.

FIG. 2 shows the spectral transmission of reflection curves of the latter plane with the radiant energy being incident on the air side of the coating. The spectral curves indicate that the coated pane has excellent filter characteristics. In the region of highest transmission, which constitutes the visible light region reflectivity is minimal. On the other hand, as the infrared region is approached, curves swing in the opposite directions, so that in the near infrared, a correspondingly high reflectivity is obtained with a minimum of transmissivity. In practice, infrared reflectivities of 92% can be achieved while light transmissivities in the visible light range of 83% are common.

We claim:

1. A method of coating a transparent substrate with a multilayer optical filter which comprises the steps of:
    (a). applying a reflective silver coating to said substrate;
    (b). thereafter applying a protective coating to said silver coating of a metal oxide by magnetron cathode sputtering at an S protective coating rate and in an S protective coating partial pressure;
    (c). thereafter applying by magnetron cathode sputtering a dereflective metal oxide coating at an E dereflective coating-oxygen partial pressure and at an E dereflective coating rate; and
    (d). controlling the coating rates during the application of said protective and dereflective coating so that the S partial pressure is less than the E partial pressure and the S coating rate is less than the E coating rate.

2. The method defined in claim 1 wherein said dereflective coating is applied by reactive magnetron cathode deposition.

3. The method defined in claim 1 wherein said protective coating is applied by reactive magnetron cathode sputtering.

4. The method defined in claim 3 wherein said protective coating is appied by sputtering using as a target at least one substance selected from the group which consists of tin, indium, tin-doped indium, lead, zinc, titanium and tantalum.

5. The method defined in claim 1 wherein said protective coating is applied by magnetron sputtering from a target selected from the group which consists of tin oxide, indium oxide, tin oxide-doped indium oxide, lead oxide, zinc oxide, titanium oxide and tantalum oxide.

6. The method defined in claim 1 wherein the S partial pressure and the S coating rate during the application of the protective coating are both less by a factor of at least 0.5 than the E partial pressure and E coating rate during application of the dereflective coating.

7. The method defined in claim 1 wherein said silver coating is applied in a thickness between substantially 50 Å and 300 Å, the protective coating is applied in a thickness between substantially 20 Å and 100 Å and the dereflective coating is applied in a thickness of substantially 250 Å and 600 Å.

8. The method defined in claim 1 wherein the S partial pressure is at most $3 \times 10^{-4}$ mbar and the S coating rate is at most 8 Å per second during the application of the protective coating and the E partial pressure is at least $7 \times 10^{-4}$ mbar and the E coating rate is at least 20 Å per second during the application of the dereflective coating.

9. The method defined in claim 8 wherein the E coating rate is substantially 35 Å per second to 40 Å per second.

10. An optical filter made by the method of claim 1.

* * * * *